(12) United States Patent
 Cerini

(10) Patent No.: US 10,187,709 B2
(45) Date of Patent: Jan. 22, 2019

(54) MODULAR SWITCHBOARD TERMINAL BLOCK WITH MEANS FOR TRANSMISSION OF OPTICAL DATA SIGNALS

(71) Applicant: Morsettitalia S.p.A., Milan (IT)

(72) Inventor: Silvano Cerini, Albisola Superiore (IT)

(73) Assignee: MORSETTITALIA S.P.A., Milan (IT)

( * ) Notice: Subject to any disclaimer, the term of this patent is extended or adjusted under 35 U.S.C. 154(b) by 0 days.

(21) Appl. No.: 15/493,530

(22) Filed: Apr. 21, 2017

(65) Prior Publication Data

US 2017/0311057 A1 Oct. 26, 2017

(30) Foreign Application Priority Data

Apr. 22, 2016 (IT) .................. 102016000041983

(51) Int. Cl.
| | |
|---|---|
| *H04B 10/00* | (2013.01) |
| *H04Q 11/00* | (2006.01) |
| *G08B 5/36* | (2006.01) |
| *H04B 10/80* | (2013.01) |
| *H01R 9/26* | (2006.01) |
| *H01R 13/66* | (2006.01) |
| *H01R 13/717* | (2006.01) |
| *H05K 7/14* | (2006.01) |

(52) U.S. Cl.
CPC .......... *H04Q 11/0005* (2013.01); *G08B 5/36* (2013.01); *H01R 9/2658* (2013.01); *H01R 9/2675* (2013.01); *H01R 9/2691* (2013.01); *H01R 13/6658* (2013.01); *H01R 13/7175* (2013.01); *H04B 10/801* (2013.01); *H04B 10/808* (2013.01); *H05K 7/1469* (2013.01); *H04Q 2011/0039* (2013.01)

(58) Field of Classification Search
CPC .... H04Q 11/0005; G08B 5/36; H04B 10/801; H04B 10/808; H01R 9/2658; H01R 9/2675; H01R 9/2691; H01R 13/6658; H01R 13/7175; H05K 7/1469
USPC ......................................... 398/118
See application file for complete search history.

(56) References Cited

U.S. PATENT DOCUMENTS

| | | |
|---|---|---|
| 2004/0218288 A1 | 11/2004 | Pierson et al. |
| 2009/0269075 A1 | 10/2009 | Wong et al. |
| 2013/0084044 A1* | 4/2013 | Ertel .................. G02B 6/428 385/88 |
| 2016/0191166 A1 | 6/2016 | Wang et al. |

FOREIGN PATENT DOCUMENTS

CN 104503044 A 4/2015

OTHER PUBLICATIONS

Ayala Perriello, M.; Search report & written opinion issued in connection with priority Italian Application No. 102016000041983 (IT UA20162828); search completed Dec. 13, 2016.

* cited by examiner

*Primary Examiner* — Tesfaldet Bocure

(57) ABSTRACT

Modular switchboard terminal block (10,20) for transmission of data signals (2) is provided, comprising a container (10a,20a) having, arranged inside it, a printed circuit (30) for processing the data signals, which has two opposite sides (30a,30b) in a transverse direction (Y-Y); connectors (11;21) for electrical connection to controlled/detection devices; and a rear end face provided with hook and spring means for mounting on a DIN switchboard rail (6).

13 Claims, 3 Drawing Sheets

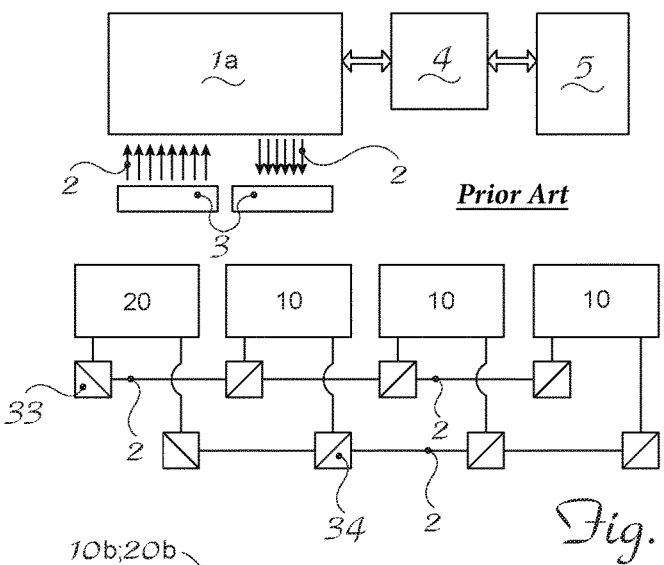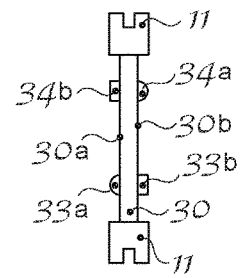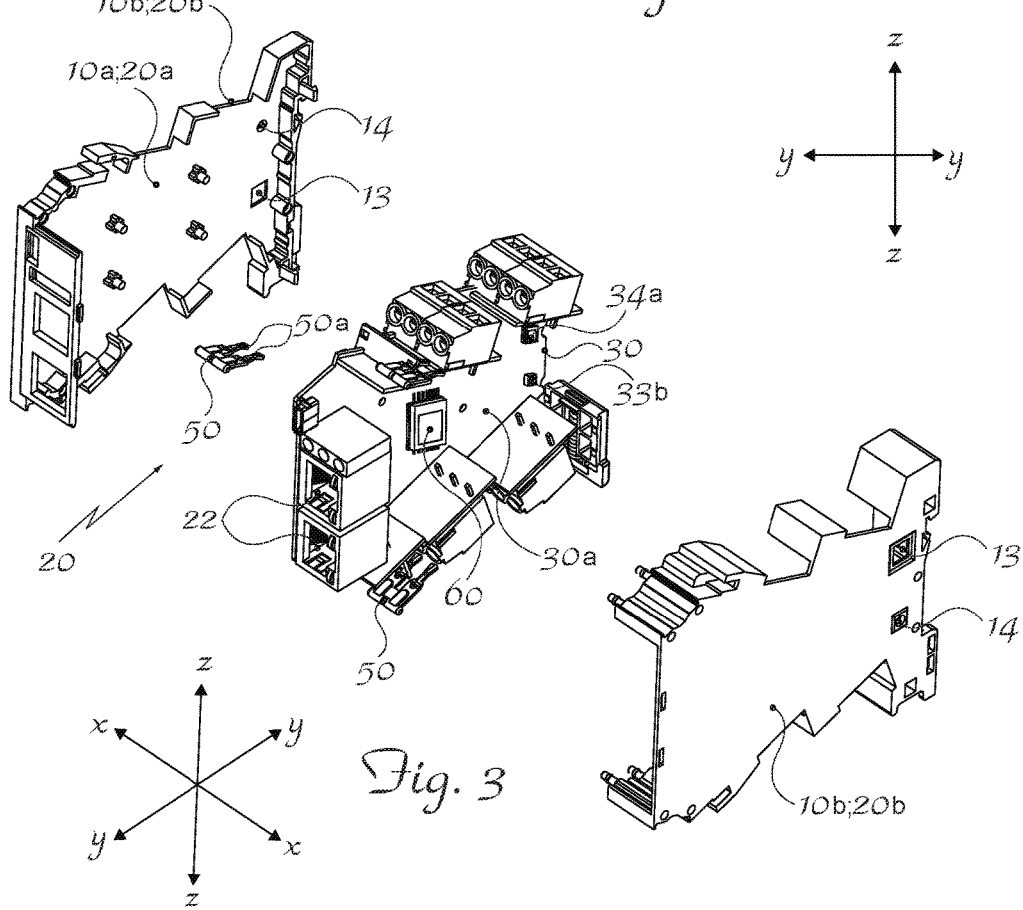

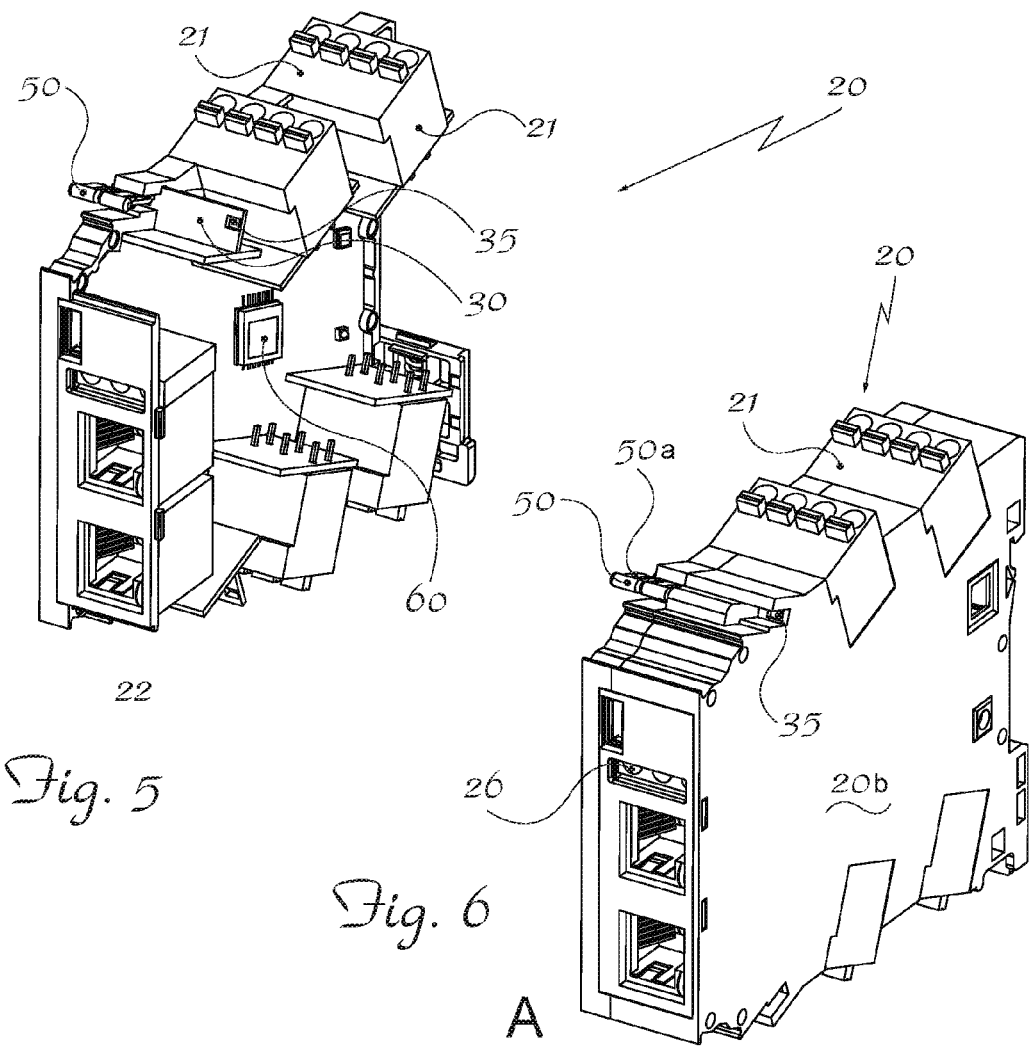
Fig. 5
Fig. 6
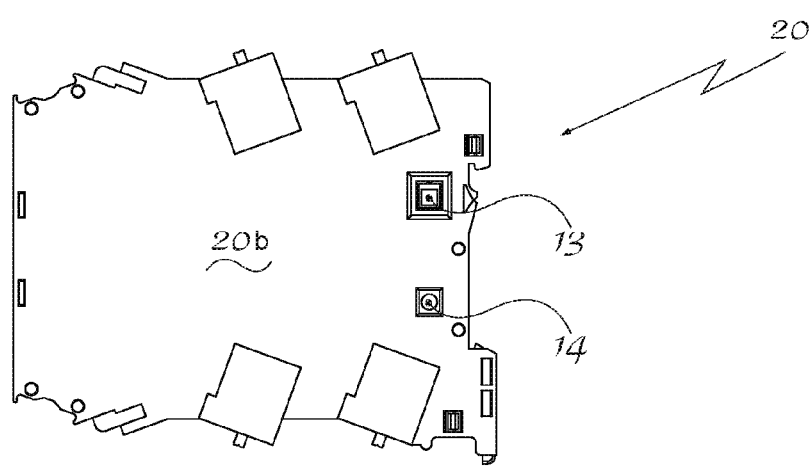
Fig. 7

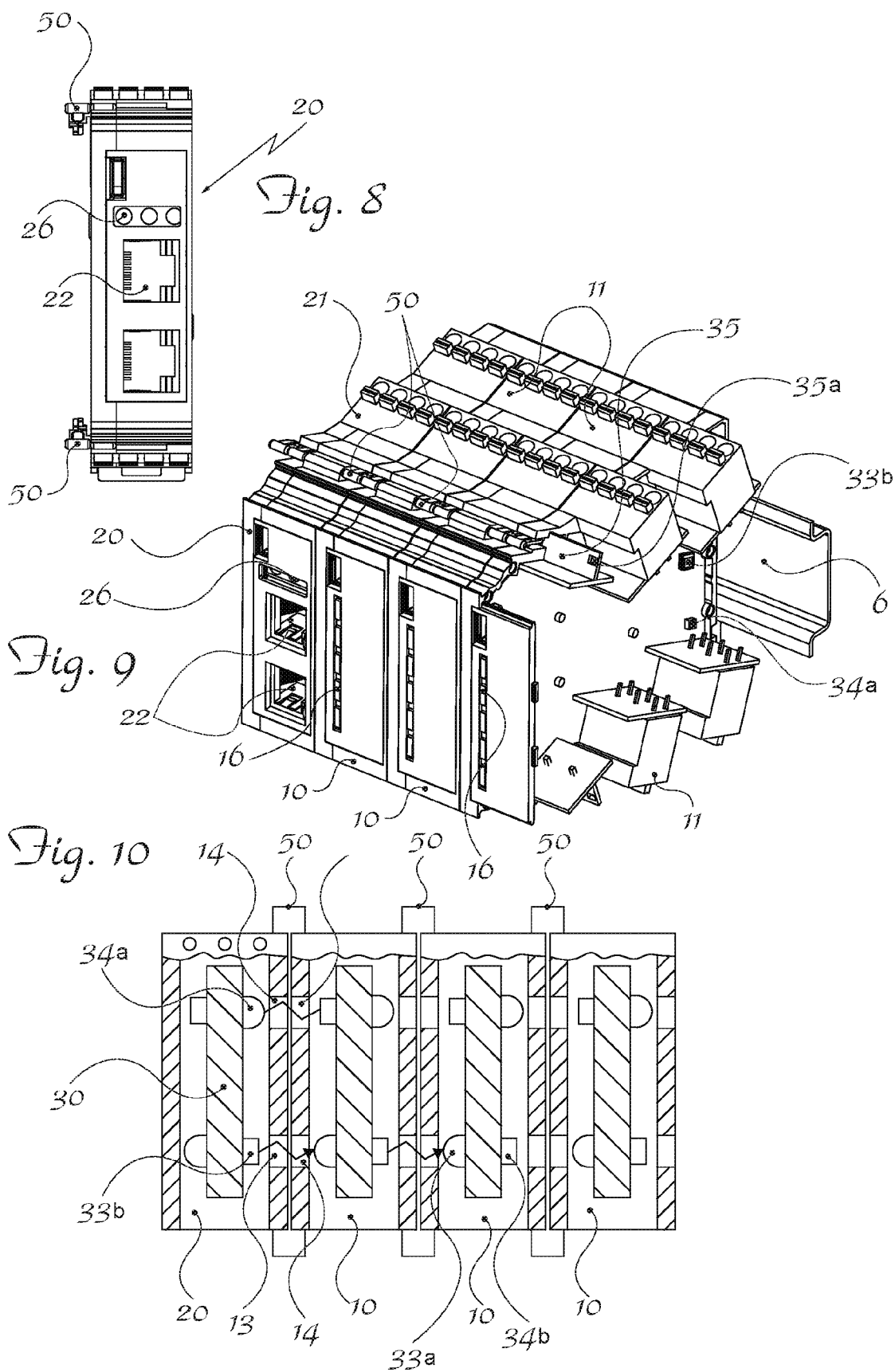

MODULAR SWITCHBOARD TERMINAL BLOCK WITH MEANS FOR TRANSMISSION OF OPTICAL DATA SIGNALS

CROSS-REFERENCE TO RELATED APPLICATIONS

The present application claims priority to Italian patent application no. 102016000041983, filed on Apr. 22, 2016.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not applicable.

STATEMENT REGARDING PRIOR DISCLOSURES BY THE INVENTOR OR A JOINT INVENTOR

Not applicable.

BACKGROUND OF THE INVENTION

Field of the Invention

The present invention relates to a modular switchboard terminal block having means for the reception and transmission of optical signals.

Description of Related Art

In the technical sector of process control so-called distributed I/O connection systems for the transmission of data signals are known, these being essentially formed (see FIG. 1) by a plurality of slave elements arranged in the vicinity of the local detection devices 3 and/or peripheral devices to be controlled—such as temperature sensors and/or printers and the like for acquiring/emitting electrical data signals 2 from/to the said devices—and by a further element 4, called master element, which is designed to be connected by means of predefined protocols, e.g. of the Ethernet type, to a data collection and processing device 5 which is normally remote and also to send/receive data signals to/from the slave devices.

It is also known that, in a non-exclusive embodiment, these data acquisition/emission elements may be formed as switchboard terminal blocks, that are devices having terminals for connecting with electric wires.

The connection between the various known terminal blocks is of the electrical type and involves the connection of each of them to a common distribution board by means of special contacts and wiring cables, so-called buses, which give rise to a series of technical problems due to the need to provide the contacts on each element and on the distribution board and also because of their sensitivity to electromagnetic disturbances, which are particularly significant in the case of management of both digital and analog low-voltage data signals.

Furthermore, mechanical disturbances are originated as a consequence of the vibrations that are generated within the switchboard, these disturbances greatly penalize the efficiency of the electrical contacts.

The high number of contacts needed to provide a distributed network therefore gives rise to corresponding high costs for production and management of the different types of contact systems and therefore for storage and distribution, as well as a high probability of transmission errors, due to the said electromagnetic disturbances and mechanical disturbances, and also due to the wear affecting the known terminal blocks.

Also known in the art are optical connectors for optical fibres and the like which are designed for reception and transmission of optical signals; examples of these devices are for example described in US 2016/0191166 and US 2004/0218288.

BRIEF SUMMARY OF THE INVENTION

The technical problem which is posed therefore is that of providing a modular switchboard terminal block which is able to acquire/distribute data signals, in particular, but not exclusively, for distributed networks and which is able to eliminate the drawbacks of the prior art and in particular the need for a large number of electrical contacts and the sensitivity to electromagnetic and/or mechanical disturbances.

In connection with this problem it is also required that this modular terminal block should be able to transmit a power supply, should have small dimensions, be easy and inexpensive to produce and assemble and be able to be easily installed at any user location using normal standardized connection means.

These results are achieved according to the present invention by a modular switchboard terminal block provided with optical means for the reception/transmission of data signals as described herein.

BRIEF DESCRIPTION OF THE SEVERAL VIEWS OF THE DRAWINGS

Further details may be obtained from the following description of a non-limiting example of embodiment of the subject of the present invention, provided with reference to the accompanying drawings, in which:

FIG. 1: shows a block diagram of a distributed I/O network configuration according to the prior art;

FIG. 2: shows a block diagram of a distributed I/O network according to the present invention;

FIG. 3: shows an exploded, schematic, perspective view of a modular element according to the present invention;

FIG. 4: shows a schematic view of the rear end face of a printed circuit with the control electronics of the modular element according to the present invention;

FIG. 5: shows a schematic perspective view of a master modular element according to the invention in the open condition;

FIG. 6: shows a schematic perspective view of a modular element of the master type in the closed condition;

FIG. 7: shows a lateral the master modular element;

FIG. 8: a front view of the master terminal block of FIG. 6;

FIG. 9: shows a perspective view of terminal blocks according to the invention mounted on a DIN rail and electrically connected together; and FIG. 10: is a schematic cross-section of the assembly according to FIG. 9.

DETAILED DESCRIPTION OF THE INVENTION

As shown in FIGS. 2-6 and assuming solely for the purposes of easier illustration and without any limiting meaning a set of three reference axes, i.e. in a longitudinal direction X-X of width, transverse direction Y-Y of depth and vertical direction Z-Z of height of the terminal block, as well as a front part A corresponding to the visible part of the modular element and a lateral part for connection of the various modules in the transverse direction Y-Y, two modules according to the invention will be described below, i.e. slave module 10 and master module 20, illustrated and described with reference to a preferred embodiment of the modular element realized as a switchboard terminal block designed to be engaged with a DIN rail 6 (FIG. 9). As shown in FIG. 3, a slave modular element 10 or master modular element 20 according to the invention comprises:

- a containing half-shell 10*a*,20*a*;
- a half-shell 10*b*,20*b* for laterally closing the modular element 10,20;
- active electronic circuits 60 designed for the reception and transmission of signals and/or for processing of the signals, e.g. for optical-electrical-conversion thereof and vice versa, and in the example assembled on a printed circuit 30 inside the master element 20 and the slave element 10;

The following are located on the printed circuit:

- at least one first receiver/transmitter pair 33 for propagation of respective optical signals 2, in a first flow direction parallel to the transverse direction Y-Y and comprising a first transmitter device 33*a* arranged on one side 30*a* of the printed circuit 30 two opposite sides, and a first receiver device 33*b* arranged on the other side 30*b*, and situated opposite each other;
- at least one second transmitter/receiver pair 34 for propagating respective optical signals 2 in a second direction of flow parallel to the transverse direction Y-Y and comprising a second transmitter device 34*a* arranged on the other side 30*b* on which the first receiver device 33*b* is arranged and a second receiver device 34*b* arranged on the side 30*a* on which the first transmitter device 33*a* is arranged, situated opposite each other; said receiver/transmitter pairs 33;34 being suitably positioned at a distance from each other in the vertical direction Z-Z, so as to prevent interference between the two data transmission channels.

In this way each modular element has electronic circuits comprising a receiver device 33*b*;34*b* and a transmitter device 34*a*,33*a* of a respective first and second receiver/transmitter pair 33;34, arranged in a predefined position in the vertical direction Z-Z and in opposite directions of the transverse direction Y-Y, for example on each side 30*a*,30*b* of the printed circuit 30, so as to define two different directions of propagation of the optical signals 2 from/towards the other slave modular elements 10 and/or master modular elements 20.

In a position corresponding to said receiver/transmitter devices the side surfaces of the two containing half-shells 10*a*,20*a* and closing half-shells 10*b*,20*b* have a respective reception window 13 and a respective transmission window 14 in the preferred example shown being respectively formed by openings which are different from each other, for example square and circular.

According to preferred aspects of the invention it is envisaged that:

- a slave module 10 comprises (FIG. 9) connectors 11 for electrical connection to (wires for input/output to/from) the various controlled and/or detection peripheral devices (not shown) for input (I) and output (0) of the electrical data signals that are processed by the slave module 10 and passed on in the direction towards the master module and from the latter to the remote processor 5 and, vice versa, from the latter to the master element 20 and then to the slave elements 10 and to the controlled/detection devices 3 connected thereto;
- a master module 20 comprises in turn connectors 21 for electrical connection to eventual controlled/detection devices, for the input (I)/output (O) of the data signals, and/or for electrical connection towards power supply and ground sources, as well as further dedicated connectors 22, for connection to/from the remote processor 5; in the example shown the connectors connected to the remote processor are of the Ethernet/Ethercat type for connection by means of wiring to the said remote processor 5.

According to the invention it is therefore envisaged that the slave module 10 and the master module 20 are provided with respective means for transmission/propagation of optical signals, designed to propagate, in directions parallel to the transverse direction Y-Y from/to slave modules 10 connected in series and/or in line from/to the master module 20 in turn connected in series; the optical signals being generated and/or processed by means of the printed circuit 30 circuits 60 and of downstream transducers (=input/output to the slave modules) and upstream transducers (=input/output to the remote processor) which are conventional per se and therefore not illustrated or described in detail.

Each slave module 10 and master module 20 further comprises means for electrical connection to adjacent slave/master modules for transmitting the power and earthing sources for power supply of the control circuits; for this purpose (FIG. 7), the printed circuit 30 comprises female connectors accessible from outside the container and suitable for connection to conducting strips 50*a* of jumpers 50 (FIG. 3,9).

As shown, the insertion of the jumpers 50 in the respective female connector 35 gives rise to both an electrical series connection of two adjacent terminal blocks and a mechanical connection between them, ensuring their stability and rigidity.

In a preferred embodiment, the female connectors 35 of the printed circuit are provided on different opposite sides of the terminal block so as to define in an unambiguous manner the power line (Volt) and the earth line (GND), thus avoiding connection errors which could result in damaging short-circuits.

In addition to the above it is preferred to arrange the electric power supply lines in a position at a distance from the optical transmission lines in the vertical direction Z-Z in order to prevent an eventual interference, cause of disturbances.

According to the invention it is envisaged that the master terminal block is designed to generate optical data signals and to transmit by means of a jumper 50 an electric power supply, received for instance from a wire connected to the electrical connector 21, to the single slave modules 10, for powering thereof; these latter are able to receive and process data signals assigned to them and/or forward to other slaves modules the data signals emitted by the master device and not assigned to them and/or transmit an electric power supply to adjacent terminal blocks by means of a jumper.

Preferably, the modules according to the invention, which are shown by way of example in the form of a terminal block, have a rear end face provided with hook and spring means for mounting on DIN switchboard rails 6.

With this configuration of modular switchboard terminal blocks of the slave type 10 and master type 20, it is possible to provide distributed data communication networks, operation of which is based on the transmission of optical signals which will comprise an addressing part intended to specify the destination module 10,20 for which the information passing through the slave modules 10 to the master module 20 or vice versa is intended; if, along the travel path, the signal encounters the destination slave or master module, it is recognized by the latter and the control electronics forward it, following optical-electric conversion, to the final destination (controlled/detection) device; if instead the signal is not recognized as assigned to the slave 10, it is transmitted to the transmitter 33a,34a depending on the direction of the travel path and forwarded by the latter towards the adjacent slave module inside which the sequence is repeated.

It is therefore clear how the switchboard terminal blocks according to the invention for the transmission of data by means of optical signals allow connection together of the various modules by means of simple contact of the respective adjacent side surfaces, said contact bringing the respective optical receiver/transmitter means of each side of the printed circuit into alignment with the transmitter/receiver means of the other module, resulting in two different transmission and reception channels along which the optical signals travel, thus being able to eliminate the drawbacks of the prior art and in particular the need for a large number of electrical contacts.

In addition to this the use of optical transmission modules according to the invention also results in the substantial elimination of the mechanical disturbances resulting from vibrations and electromagnetic disturbances resulting the connector connections of the prior art, having moreover small dimensions, being easy and inexpensive to produce and assemble, not being prone to wear and being able to be installed easily in any user location using normal standardized connection means.

Preferably, each slave module 10 or master module 20 comprises indicators 16,26 for indicating an enable/disabled condition, for example consisting of LEDs which may optionally be differently coloured, for indicating the different condition/state of the module; preferably the indicators are arranged according to different alignments for the master and slave devices.

A further advantage arising from the configuration of the modules according to the invention is the elimination of any errors in the connection between adjacent modules; the asymmetrical configuration of the windows 13,14 of the half-shells 10a,10b 20a,20b provides an unambiguous guide for the user.

In addition to the above, owing to the particular configuration with two opposite sides, the master terminal block may be arranged on either one of the opposite ends of the DIN rail, but also in an intermediate position between several slave terminal blocks arranged on opposite sides of the master module in the transverse direction Y-Y parallel to which propagation of the optical data signal occurs.

Although described in connection with a number of embodiments and a number of preferred examples of embodiment of the invention, it is understood that the scope of protection of the present patent is determined solely by the claims below.

The invention claimed is:

1. Modular switchboard terminal block (10,20) for transmission of data signals (2), comprising
    a container (10a,20a) having at least two side surfaces (10b,20b) situated parallel and opposite each other in a transverse direction (Y-Y),
    a printed circuit (30) for processing the data signals, which has two opposite sides (30a,30b) in the same transverse direction (Y-Y) and is arranged inside the container;
    Connectors (11;21) for electrical connection to controlled/detection devices, for input (I) and output (O) of electrical data signals received/transmitted from/to the controlled/detection devices, and/or for electrical connection to a power/ground supply source;
    and a rear end face provided with hook and spring means for mounting on a DIN switchboard rail (6);
wherein said printed circuit (30) has, mounted thereon:
    elements (60) for electrical-optical signal conversion and/or vice versa;
    at least one first receiver/transmitter pair (33) comprising a first transmitter device (33a) on one of the two opposite sides and a first receiver device (33b) on the other of the two sides, situated opposite each other, for propagating respective optical signals (2) in a first flow direction parallel to the transverse direction (Y-Y);
    at least one second transmitter/receiver pair (34) comprising a second transmitter device (34a) on the side on which the first receiver (33b) is arranged and a second receiver device (34b) on the side on which the first transmitter (33a) is arranged, situated opposite each other in a second direction of propagation of optical signals parallel to the transverse direction (Y-Y), each side surface (10a,20a) of the container (10,20) having an associated reception window (13) and a transmission window (14) respectively arranged in alignment with the said receiver/transmitter devices (33a,33b;34a,34b) on the opposite sides (30a,30b) of the printed circuit (30).

2. Modular terminal block according to claim 1, characterized in that it comprises means for performing electrical connection to a terminal block adjacent in the transverse direction (Y-Y), for connection towards power sources and earthing for the power supply of the circuits.

3. Modular terminal block according to claim 2, characterized in that said electrical connection means comprise female connectors (35) arranged on the printed circuit (30) and accessible from outside the container (10;20), for coupling with a respective conducting strip (50a) of a jumper (50).

4. Modular terminal block according to claim 1 characterized in that the container comprises a half-shell (10a,20a) for containing and a half-shell (10b,20b) for laterally closing the modular element (10,20), inside which the said printed circuit (30) is housed.

5. Modular terminal block according to claim 1, characterized in that it comprises indicators (16,26) for indicating an operating condition.

6. Modular terminal block according to claim 5, characterized in that said indicators (16,26) are formed by differently coloured LEDs suitable for indicating the different condition of the module.

7. Modular terminal block according to claim 1, characterized in that it comprises an Ethernet or ethercat connector (22) for connecting to an external processing unit (5).

8. Modular terminal block according to claim 7 characterized in that it is of the master type, designed to generate/transmit/receive optical signals (2), to connect to an electric power supply/ground source and to connect to an external processing unit (5).

9. Modular terminal block according to claim 1, characterized in that it is of the slave type, designed to receive/transmit/forward optical signals (2) and to receive/transmit electrical signals from/to controlled/detection devices connected thereto.

10. Distributed I/O network for the transmission of data signals (2) from/to local detection devices and/or peripheral units to be controlled, characterized in that it comprises at least two modular terminal blocks according to claim 1, arranged adjacent each other in the transverse direction (Y-Y).

11. Distributed I/O network according to claim 10, characterized in that the terminal blocks are arranged along a same DIN rail (6).

12. Distributed I/O network according to claim 10, characterized in that it comprises a terminal block of the master type and one or more slave terminal blocks adjacent.

13. Distributed I/O network according to claim 10, characterized in that the adjacent terminal blocks are electrically connected by means of jumpers (50).

* * * * *